United States Patent [19]

Peterson

[11] 3,952,625

[45] Apr. 27, 1976

[54] ELECTRONIC TUNING DEVICE

[76] Inventor: Richard H. Peterson, 11748 Walnut Ridge Drive, Palos Park, Ill. 60464

[22] Filed: Feb. 18, 1975

[21] Appl. No.: 550,523

[52] U.S. Cl. .................................. 84/454; 84/1.01; 84/DIG. 18; 324/79 D

[51] Int. Cl.$^2$ ..................... G10G 7/02; G01R 23/14

[58] Field of Search .............. 84/1.01, 454, DIG. 18; 324/79 R, 79 D; 328/17, 18, 25; 331/61

[56] References Cited

UNITED STATES PATENTS

| | | | |
|---|---|---|---|
| 2,584,277 | 2/1952 | Long | 84/DIG. 18 |
| 2,806,953 | 9/1957 | Krauss | 84/454 X |
| 3,509,454 | 4/1970 | Gossel | 324/79 R |
| 3,861,266 | 1/1975 | Whitaker | 84/454 |
| 3,879,684 | 4/1975 | Sanderson | 84/DIG. 18 |

*Primary Examiner*—L. T. Hix
*Assistant Examiner*—Stanley J. Witkowski
*Attorney, Agent, or Firm*—Jones, Tullar & Cooper

[57] ABSTRACT

An Electronic Tuning Device for tuning musical instruments employes a single radio frequency oscillator. Frequency dividers are used to divide the frequency of the radio frequency oscillator (clock) by various divisors so as to produce a series of notes that approximate a desired musical scale. A note selector selects a particular note for use as a reference frequency against which a musical instrument to be tuned can be compared. The note selector also controls means for shifting the frequency of the master oscillator slightly so as to place the frequency of the selected note exactly at its proper position in the desired musical scale. A vernier control is provided by means of which the master oscillator can be altered so as to cause all of the notes to be sharped and flated up to about a half semitone. The generated note, or a sub octave of same, can be used for direct audible comparison with an instrument to be tuned or the selected tone can be divided to a low frequency and used as a frequency reference for deriving a voltage to drive a synchronous motor which is in turn used to drive a stroboscopic disc. In this mode of operation an audio amplifier picks up a signal from the instrument to be tuned and causes a lamp to flash at the frequency that the instrument is sounding, and when the instrument is in exact tune with the selected note, the tone wheel will appear to be standing still.

10 Claims, 2 Drawing Figures

ELECTRONIC TUNING DEVICE

BACKGROUND OF THE INVENTION

This invention relates to an electronic tuning device of the type used for tuning musical instruments or in training music students. My prior U.S. Pat. No. 2,924,776 issued Feb. 9, 1960 describes one such tuning device in the form of an audio frequency pitch standard that is capable of producing accurately pitched sounds from all of the notes of a musical scale over a range of many octaves. Another tuning device employes a stroboscope to provide a visual comparison of the pitch of a musical note picked up by a microphone, with a stroboscope disc revolving at a speed determined by an accurate frequency standard. Such an instrument is shown in U.S. Pat. No. 2,806,953 issued to S. L. Krauss on Sept. 17, 1957. The present invention applies to improvements in the type of devices mentioned.

It is one object of the present invention to provide an improved tuning device having greater accuracy and stability than those previously known. It is another object of the invention to provide an improved tuning device that can operate an audio frequency pitch standard for audible comparison with an instrument to be tuned or that alternately or simultaneously can be used with a stroboscopic or other visual readout device. These and other objects of the invention will become apparent from the description which follows.

SUMMARY OF THE INVENTION

Devices according to the present invention employ a single radio frequency oscillator from which all other frequencies are derived by frequency division. Since all of the frequencies of the standard equitempered scale are not exactly divisible from any practically obtainable higher frequency, less than perfect accuracy of the tempered intervals can be achieved. Of course, the higher the frequency of the radio frequency oscillator (clock) the greater the accuracy that can be obtained, but at the cost of more complication of the frequency dividing system. Integrated circuits have been developed which can produce approximations of the 12 semitones of the equitempered musical scale in the octave between approximately 4000 $H_z$ and 8000 $H_z$ by frequency division from a clock frequency of about 2 megahertz. Lower octaves of the same scale can then be easily produced by simple two to one frequency division. These integrated circuits were designed to be used in electronic organs and for this purpose, at least for inexpensive organs, the temperament accuracy is at least marginally acceptable. To provide an unimpeachable tuning standard with which any musical instrument can be compared however really requires accuracy about an order of magnitude greater. In the present invention, extra means are provided for "pulling" or modifying the clock frequency very slightly in order to correct the inherent inaccuracy of the basic frequency divider system, or whatever single semitone it is desired to produce at the moment. This is possible in the tuning instrument of the invention because only one standard frequency is required at any one time. If it is desired to provide an audio frequency standard only, for audible comparison with the instrument to be tuned, an output signal is derived from a chain of two to one frequency dividers, thus providing a signal of the proper frequency to a conventional amplifier and loudspeaker.

For some purposes a visual method of comparing the frequency of the standard with a frequency of the instrument to be tuned is highly desirable. For this purpose the stroboscope system of comparison as shown in the aforementioned U.S. Pat. No. 2,806,953 is well suited. While either a visual or audible tuning method may be used for tuning most musical instruments, there are times when having both systems simultaneously available is extremely helpful. This is commonly the case when tuning pianos where it is generally easier to tune by the audible method. But certain intervals particularily in the low and high ends of the scale, are sometimes very hard to hear and resonances in the piano sounding board or other parts sometimes render the pitch beats that are the basis of audible tuning, difficult to hear. An audiovisual tuner is also very valuable for intonation training in connection with the playing of orchestral instruments or for training the human voice. Visual tuners of the stroboscopic variety use a motor driven disc having a number of concentric rows, or circles, of alternate light and dark spots, with the number of spots in each next outer concentric row having twice as many spots as does the adjacent one. Thus the inner row may have two spots, the next row 4 spots, the next 8, the next 16, and so on. If the disc is rotated at a speed of 16 revolutions per second, which equals 960 revoluations per minute, it will be readily apparent that a light flashing in synchronism with the pitch of a musical tone having a frequency of 256 Hz will cause the fourth band of the disc to have its spots in identical positions each time the light flashes and accordingly it will appear to be standing still. If the tone is slightly flat of 256 Hz, the disc will appear to be rotating slowly in a counterclockwise direction. If the tone is sharp, the disc will appear to be rotating in a clockwise direction. In such systems it is of the utmost importance that there be no wobble or non-uniformity of the speed of the disc, or the stroboscopic "picture" will appear to jitter back and forth and be very unsatisfactory for the intended purpose. It has been found that if gears are used between the driving motor and the stroboscope disc it is very difficult to avoid such jitter. It is thus a great advantage to be able to attach the disc directly to the shaft of a smooth running synchronous motor. Many kinds of small synchronous motors are available, but it is a problem that the speed of rotation, at a power supply current of a given frequency, is determined by motor design considerations that make it impractical to manufacture motors, without gears, that operate at a speed commensurate with the frequency of a musical note so that the stroboscope disc will provide a proper readout of a given musical note when the motor driving the disc is supplied with current having a frequency of the note. This problem is solved in the present invention by an arrangement of two sets of frequency dividers having different divisors; one to operate an audio amplifier and loudspeaker for audible pitch comparison, and another to derive a signal of a different frequency which is then connected to a motor drive amplifier and used to drive the synchronous motor operating the strobe disc. This permits the motor to operate at the speed required to give a visual readout that corresponds exactly with the audible tone.

DESCRIPTION OF THE PREFERRED EMBODIMENTS

Figure 1:
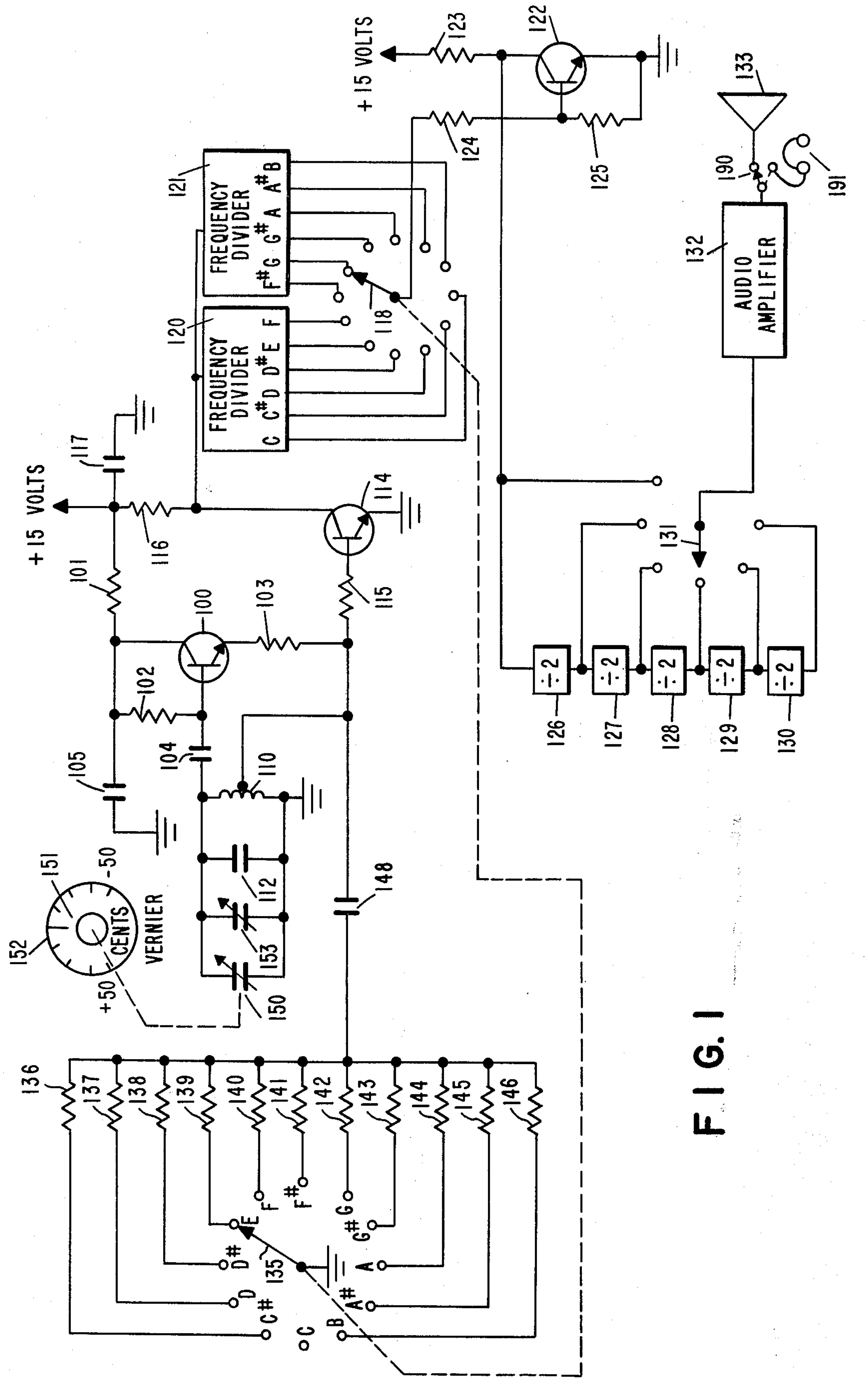
FIG. 1 is a schematic diagram of an audio type tuning instrument according to the invention.

Referring first to FIG. 1, transistor 100, and resistors 101, 102, and 103, capacitors 104 and 105, inductor 110, and tuning capacitor 112 form a Hartley oscillator circuit that is tuned to approximately 2 megahertz. Transistor 114, resistors 115 and 116, and capacitor 117, comprise a pulse shaping circuit that squares the signal produced by the Hartley oscillator and provides pulses of suitable shape to trigger the dividing circuits which are included in the integrated circuits 120 and 121. Each of these integrated circuits contains a number of sets of frequency dividers, each set adapted to divide the 2 megahertz input signal down to an audio frequency representing one of the semitones of the musical scale in the octave between roughly 4000 $H_z$ and 8000 $H_z$. For example if 2 megahertz is divided by 478 the dividend frequency is 4184.1 $H_z$, which corresponds approximately to the note C in the equitempered scale. Dividing 2 megahertz by 451 produces a note close to C sharp at 4434.5898 $H_z$. In like manner by dividing the 2 megahertz "clock" by divisors of 426 - 402 - 379 - 358 - 338 - 319 - 301 - 284 - 268 and 253, we get notes D (4694.8356 Hz) through B (7905.1383 $H_z$) respectively. Suitable integrated circuits are manufactured by Motorola Inc. under the designation MM 5555 and MM 5556. Although the frequencies thus derived are close to the proper frequencies, they are not exact; several of the notes being enough out of tune to be very noticeable to a trained ear especially when played in chords.

Switch 118 is a note selector for selecting which note is to be used as a basis for tuning a musical instrument. Transistor 122 and resistors 123, 124 and 125 comprise an amplifier and pulse shaper, with its output connected to the chain of divide by two flip flops 126, 127, 127, 129, 130. Switch 131 connects either the output of the pulse shaper or the output of one of the flip flops to an audio amplifier 132 which is connected to loudspeaker 133. Switch 131 is thus an octave selector for determining which octave of the note selected is to be heard.

In order to correct for temperament inaccuracies in the primary divider system, a second switch element 135 is ganged wth the note selector switch 118 for operating a pitch corrector circuit comprised of a selected one of resistors 136 through 146, and capacitor 148. The resistors 136 through 146 are selected to adjust the amount of radio frequency current flowing through capacitor 148 and thus "pull" the frequency of the oscillator by an amount required to bring the selected note to its exact position in the musical scale.

The vernier capacitor 150 is adjustable, by the operator, by means of the knob 151 which has a dial 152 calibrated in "cents" or 100ths of a semitone. Its range is preset at the factory by adjusting the trimmer capacitor 153 and is set to provide a range of adjustment up to one-half semitone sharp and flat of the center, or nominal, frequency.

Figure 2:
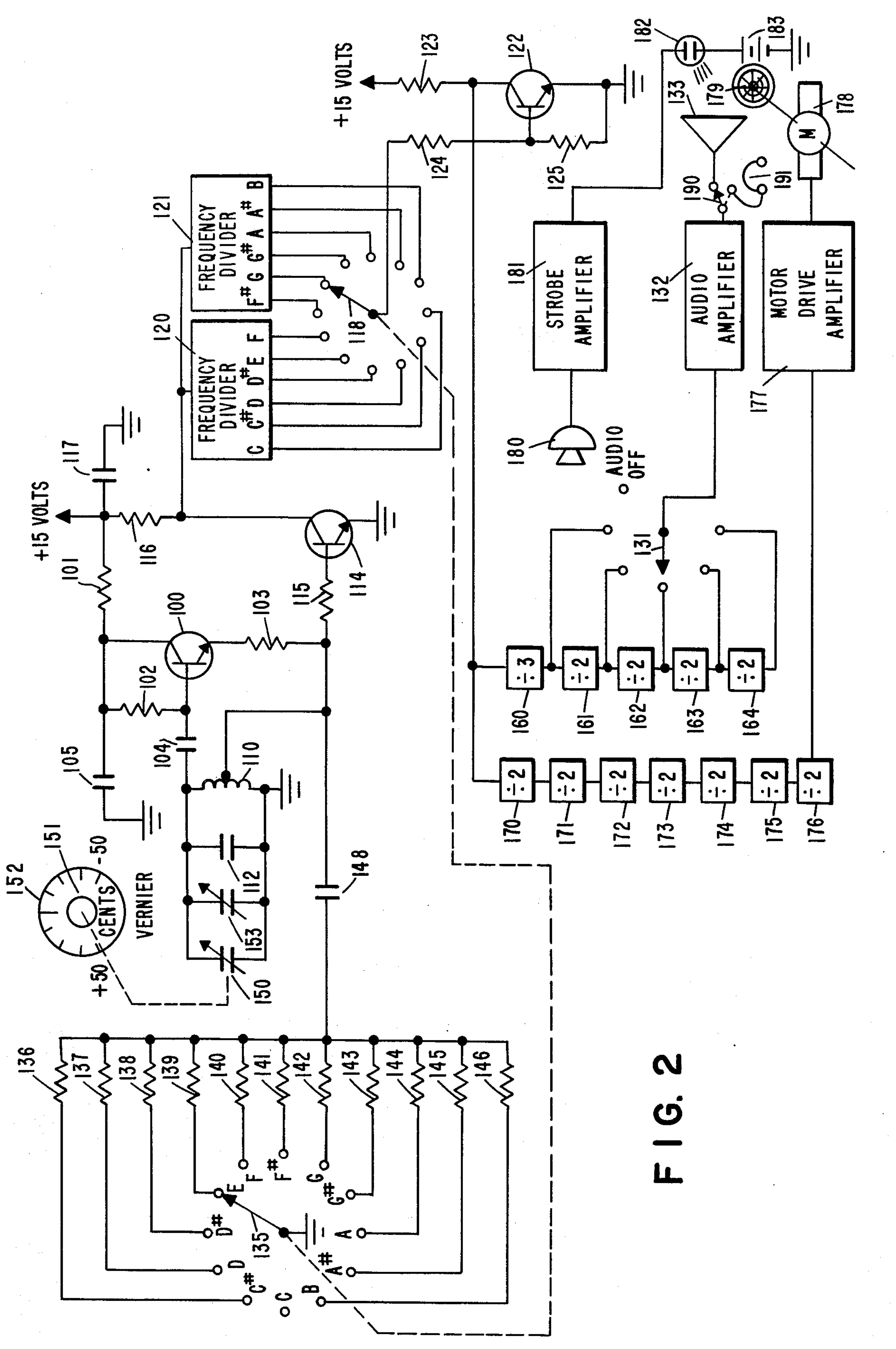
FIG. 2 is a schematic diagram of an audio - visual -visual tuning instrument according to the invention.

FIG. 2 discloses a utilization circuit comprising audio-visual means for use with the tuner shown in FIG. 1. Much of the circuit is similar and like elements have been given identical reference characters. An important difference is that the radio frequency oscillator is now tuned to a frequency of three megahertz instead of 2 megahertz. The output of the shaper transistor 122 is connected to a divide by 3 frequency divider 160, in cascade with a series of divide by two frequency dividers 161, 162, 163 and 164. The outputs of these frequency dividers are connected as before to an octave selector switch 131, amplifier 132 and loudspeaker 133.

Also connected to the output of the shaper transistor 122, is another chain of seven divide by two flip flops 170 through 176. These divide the frequency of the note selected by note selector switch 118 by 128. The signal thus derived is connected to motor drive amplifier 177 which amplifies it to a level suitable for operating the synchronous motor 178 which turns the strobe disc 179, which may be constructed in a conventional manner as shown in U.S. Pat. No. 2,806,953 previously referred to, as well as in other patents such as U.S. Pat. No. 2,286,030. The motor 178 may be an ordinary synchronous motor designed to operate on a 60 $H_z$ power supply with a direct drive shaft speed of 1200 R.P.M., which motors are readily available.

The microphone 180 is arranged to pick up a signal from an instrument to be tuned. Strobe amplifier 181 amplifies this signal to a level sufficient to operate the strobe light 182 which is connected to a source of D.C. bias 183. The D.C. bias is necessary so that the lamp will only light once during every cycle of the frequency of the tone picked up by the microphone 180. Switch 190 allows the use of the headphones 191 instead of the loudspeaker 133 if desired. When using the audio tuner and the visual readout simultaneously it is important that the tone of the loudspeaker not be picked up too strongly by the microphone because the audio tone from the tuner will always make the strobe disc appear to stand still. The microphone should pick up the instrument being tuned only. Of course some electrical musical instruments can be connected directly into the strobe amplifier 181 without the use of the microphone, and this obviates the problem.

It will be seen that by raising the R.F. frequency to three megahertz and then dividing the frequency of the note selected by the note selector by means of the divide by three divider, the frequency of signals applied to the audio amplifier will be the same as obtained in FIG. 1, except that the highest octave obtainable will be one octave lower than in FIG. 1.

Having thus described one embodiment it will be obvious that others may readily adapt the invention to use under various conditions by employing one or more of the novel features involved.

As presently advised as to the apparent scope of my invention I desire to claim the following subject matter.

I claim:

1. A tuning device for tuning musical instruments and for intonation training, comprising:

a master oscillator operating at a radio frequency;

means including frequency dividers for simultaneously deriving from said master oscillator a series of audio frequencies that approximate the notes of a predetermined musical scale over a range of at least an octave;

a utilization circuit;

selector means for selecting only one of said notes and connecting it to said utilization circuit, whereby the selected note can be compared with the pitch of a musical instrument to be tuned; and additional means controlled by said selector means for shifting the frequency of said master oscillator slightly so as to place the selected note at its exact position in the predetermined musical scale.

2. A tuning device according to claim 1 wherein the said predetermined musical scale is the equitempered scale.

3. A tuning device according to claim 1, further including a vernier control capable of shifting said radio frequency by an amount sufficient to shift the frequencies of all of the notes of the predetermined musical scale by an amount up to ½ semitone sharp or flat.

4. A tuning device according to Claim 1 further including a series of scale-of-2 frequency dividers connected to said selector means for dividing the frequency of the note selected by said selector means to produce octavely related notes; and an octave selector switch for selecting which octave of the note selected is connected to said utilization circuit.

5. A tuning device according to claim 1, wherein said additional means comprises a pitch corrector circuit having a plurality of selectable resistors; and switch means for selecting one of said resistors for connection to said master oscillator to shift the frequency of said master oscillator.

6. A tuning device according to claim 1, wherein said utilization circuit comprises audio-visual means for comparing selected derived notes with an instrument to be tuned.

7. A tuning device for tuning musical instruments comprising:

a master oscillator;

means including frequency dividers for simultaneously deriving from said master oscillator a series of frequencies representing the notes of a musical scale;

note selector means for selecting only one of said notes;

a first series of scale of 2 frequency dividers connected to said note selector means for deriving a series of frequencies representing a plurality of octaves of the note selected by said note selector means;

an amplifier having an input and an output;

a loudspeaker connected to the ouput of said amplifier; and an octave selector switch for connecting at least one of said scale of 2 frequency dividers to the input of said amplifier whereby the selected octave of the selected note of the musical scale generated by said tuning device is produced at said loudspeaker for comparison with the pitch of a musical instrument to be tuned.

8. An audio-visual tuning device for producing a selectable audio reference frequency and a corresponding visual reference against which a musical instrument to be tuned can be compared, comprising:

a signal source producing an output signal having a frequency representing a selected note of a musical scale;

an audio circuit including an amplifier and audio transducer means connected to said amplifier;

means including a divide-by-3 frequency divider connecting said output signal to said amplifier to produce at said audio transducer means an audio tone signal representing said selected note;

a visual circuit including a synchronous motor rotating at one-third the frequency of its driving signal and stroboscopic means directly driven by said motor; and means including at least one divide-by-2 frequency divider connecting said output signal to the input of said motor to provide a driving signal for said motor, said frequency dividers producing a frequency relationship between said audio output tone and said motor driving signal which causes said motor to drive said stroboscopic means at a speed which produces a visual readout corresponding exactly with the frequency of said audio tone output, whereby the pitch of a musical instrument may be audibly compared with the frequency of said selected note by means of said audio tone signal, and may be visually compared with the frequency of said selected note by means of the speed of rotation of said motor.

9. A tuning device according to claim 8, wherein said means connecting said output signal to said amplifier further includes a series of scale of 2 frequency dividers for deriving a series of frequencies representing a plurality of octaves of said note, and selector means connecting a selected octave of said note to said amplifier for producing said audio tone signal at said audio transducer means.

10. A tuning device according to claim 9, wherein said means connecting said output signal to the input of said motor incorporates a second series of scale of 2 frequency dividers.

* * * * *